(12) United States Patent
Leng et al.

(10) Patent No.: US 11,756,328 B2
(45) Date of Patent: Sep. 12, 2023

(54) BIOLOGICAL INFORMATION IDENTIFICATION APPARATUS AND ELECTRONIC DEVICE

(71) Applicant: Shenzhen Goodix Technology Co., Ltd., Guangdong (CN)

(72) Inventors: Hanjian Leng, Guangdong (CN); Ya Wei, Guangdong (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 147 days.

(21) Appl. No.: 17/492,600

(22) Filed: Oct. 2, 2021

(65) Prior Publication Data

US 2022/0230010 A1 Jul. 21, 2022

Related U.S. Application Data

(63) Continuation of application No. PCT/CN2021/072198, filed on Jan. 15, 2021.

(51) Int. Cl.
*G06K 9/00* (2022.01)
*G06V 40/13* (2022.01)
(Continued)

(52) U.S. Cl.
CPC ...... *G06V 40/1306* (2022.01); *G02F 1/13338* (2013.01); *G06F 3/0445* (2019.05); *H01Q 1/38* (2013.01); *G06F 2203/04111* (2013.01)

(58) Field of Classification Search
CPC .............. G06V 40/1306; G06V 10/955; G06F 3/0445; G06F 2203/04111; G02F 1/13338; H01Q 1/38; G01N 27/228; A61B 5/1172
See application file for complete search history.

(56) References Cited

U.S. PATENT DOCUMENTS

2011/0298711 A1 12/2011 Dean et al.
2017/0371461 A1 12/2017 Lee et al.
(Continued)

FOREIGN PATENT DOCUMENTS

CN 103870813 A 6/2014
CN 105095887 A 11/2015
(Continued)

OTHER PUBLICATIONS

Shenzhen Goodix Technology Co.,Ltd., International Search Report, PCT/CN2021/072198, dated Sep. 26, 2021, 5 pgs.
(Continued)

*Primary Examiner* — Abdul-Samad A Adediran
(74) *Attorney, Agent, or Firm* — USCH Law, PC

(57) ABSTRACT

A biological information identification apparatus is provided, including: a fingerprint identification module and a packaging layer disposed on a surface of the fingerprint identification module facing a user, and configured to package the fingerprint identification module to insulate the fingerprint identification module from an outside environment, a top surface of the packaging layer being an arc surface. The fingerprint identification module includes: a fingerprint identification chip configured to identify fingerprint information of the user, where a plurality of capacitive pixel units are disposed on an upper surface of the fingerprint identification chip, and the capacitive pixel units are configured to form capacitance with a finger of the user; and a plurality of conductive elements disposed above the capacitive pixel units. An electronic device including the aforementioned biological information identification apparatus is provided.

20 Claims, 4 Drawing Sheets

(51) Int. Cl.
*G06F 3/044* (2006.01)
*H01Q 1/38* (2006.01)
*G02F 1/1333* (2006.01)

(56) References Cited

U.S. PATENT DOCUMENTS

| | | | |
|---|---|---|---|
| 2018/0074004 A1* | 3/2018 | Lin | G01N 27/228 |
| 2018/0300520 A1* | 10/2018 | Lin | G06V 40/1306 |
| 2018/0349662 A1* | 12/2018 | Lin | A61B 5/1172 |
| 2018/0365476 A1 | 12/2018 | Ogirko et al. | |
| 2019/0014274 A1* | 1/2019 | Lin | G06V 10/955 |

FOREIGN PATENT DOCUMENTS

| | | |
|---|---|---|
| CN | 105184287 A | 12/2015 |
| CN | 205788221 U | 12/2016 |
| CN | 107004127 A | 8/2017 |
| CN | 208384588 U | 1/2019 |
| KR | 20180026597 A | 3/2018 |

OTHER PUBLICATIONS

Shenzhen Goodix Technology Co.,Ltd., Extended European Search Report, EP 21773260.1, dated Aug. 30, 2022, 7 pgs.

\* cited by examiner

BIOLOGICAL INFORMATION IDENTIFICATION APPARATUS AND ELECTRONIC DEVICE

CROSS REFERENCE TO RELATED APPLICATIONS

The present application is a continuation of PCT Application No. PCT/CN2021/072198, filed Jan. 15, 2021, which is incorporated by reference herein in its entirety.

TECHNICAL FIELD

The present disclosure relates to the field of fingerprint identification technology, in particular, to a biological information identification apparatus and an electronic device.

BACKGROUND

As requirements on safety of mobile phones are increasing, biological identification is gradually and widely applied to identification authentication for the mobile phones. For example, a middle or high standard mobile phone is generally provided with such biological information identification apparatus as a fingerprint identification module which generally provides capacitive fingerprint identification whose principle specifically is as follows: a sensing region of a chip is divided into a plurality of small portions (hereinafter simply referred to as pixel, and a size of a single pixel corresponds to a width of a fingerprint). When a finger presses the sensing region, a peak (highest point of the fingerprint) and a valley (lowest point of the fingerprint) on the fingerprint would correspond to different pixels. Due to difference in height, a capacitance difference is generated between two pixels and would be fed back to a fingerprint identification chip to generate a fingerprint image. That is, for capacitive fingerprint identification, a magnitude of a signal mainly depends on the capacitance difference between the two pixels. Peaks and valleys on the fingerprint may be identified based on the capacitance difference to form a fingerprint image.

As full screen mobile phones are getting popular, the fingerprint identification that is initially applied to a front surface of the middle or high standard mobile phone tend to be applied to a back surface or a side surface. However, with the traditional fingerprint identification applied to a thick screen or a side surface structure of a curve screen, a magnitude of a resulting signal is insufficiently large for capacitive fingerprint identification, resulting in low accuracy of the fingerprint identification or even no fingerprint being identified.

SUMMARY

Some embodiments of the present disclosure are directed to provide a biological information identification apparatus and an electronic device to enlarge the magnitude of the signal for capacitive fingerprint identification, and further to improve accuracy of the capacitive fingerprint identification.

In order to address the above technical problem, embodiments of the present disclosure provide a biological information identification apparatus, including a fingerprint identification module and a packaging layer disposed on a surface of the fingerprint identification module facing a user. The packaging layer is configured to package the fingerprint identification module to insulate the fingerprint identification module from an outside. A top surface of the packaging layer is an arc surface. The fingerprint identification module includes a fingerprint identification chip configured to identify fingerprint information of the user, where a plurality of capacitive pixel units are disposed on an upper surface of the fingerprint identification chip, and the plurality of capacitive pixel units are configured to form capacitance with a finger of the user; and a plurality of conductive elements disposed above the plurality of capacitive pixel units.

Embodiment of the present disclosure further provide an electronic device including the biological information identification apparatus as described in the above.

Compared with a related technique, in an embodiment of the present disclosure, the fingerprint identification chip for identifying fingerprint information is provided with the plurality of capacitive pixel units, and the conductive elements are additionally provided above the capacitive pixel units. According to a calculation formula of $C=\varepsilon S/4\pi k d$ for calculating a capacitance value formed by each capacitive pixel unit during sensing a fingerprint, in which d is a distance of a top end of a conductive element from the finger (when the conductive elements are removed, d is a distance of an upper surface of a capacitive pixel unit from the finger). When the finger presses above the capacitive pixel units for identification, the additional conductive element, serving as a conductor, reduces a distance d between the fingerprint and the upper surface of the capacitive pixel unit in a disguised manner, thereby the capacitance value C of the capacitance formed by the capacitive pixel unit is increased. Therefore, when the biological information identification apparatus is applied to an electronic device, the fingerprint identification module may form a signal with a larger magnitude. Further, a possibility is reduced in which identification fails or the magnitude of the signal is too small to render sufficiently accurate identification. For example, even if an insulation element above or beyond the capacitive pixel units in the fingerprint identification module is thick, the biological information identification apparatus provided in the present disclosure is also able to perform accurate fingerprint identification.

In one example, the plurality of conductive elements are hollow.

In one example, bottoms of the plurality of conductive elements are in contact with tops of the plurality of capacitive pixel units. Through a direct contact between the conductive elements and the capacitive pixel units, the conductive elements and the capacitive pixel units may form an electrode plate configured sense to sense the capacitance formed through a finger touch. By the additional conductive elements, the distances between the upper surfaces of the capacitive pixel units and the finger are reduced in a disguised manner to enlarger the magnitude of the signal to be detected.

In one example, the fingerprint identification chip includes a middle portion and an edge portion surrounding the middle portion. Heights of the plurality of conductive elements gradually decrease in directions from the middle portion to the edge portion. In this way, a change tendency in height of the conductive elements is in accordance with the arc top surface of the packaging layer, so that distances between the top surface of the packaging layer and the top ends of the conductive elements are substantially equal. Therefore, when a finger of the user touches the top surface, distances between the top ends of the conductive elements and surface of the finger are substantially equal, which improves a condition in which there is a large difference between values of capacitances sensed by the capacitive pixel units in different regions, and is more adaptable to a case in which the biological information identification apparatus is provided below the convex region of the terminal.

In one example, cross section areas of the plurality of conductive elements are equal.

In one example, the plurality of conductive elements are conductive pillars. This facilitates not only manufacturing, but also ensuring consistency of shapes of the conductive elements, thereby improving consistency of capacitive values detected by the capacitance pixel units.

In one example, heights of the plurality of conductive elements are equal.

In one example, the fingerprint identification chip includes a middle portion and an edge portion surrounding the middle portion. Cross section areas of the plurality of conductive elements gradually decrease in directions from the middle portion to the edge portion. Since a capacitance value C sensed by each capacitive pixel unit satisfies the formula of $C=\varepsilon S/4\pi kd$, C is in positive correlation with the cross section area S of the conductive element, and in negative correlation with the distance d of the top end of the respective conductive element from the finger (i.e., a thickness of the packaging layer above the conductive element). When distances between upper surfaces of capacitive pixel units at the edge portion of the biological information identification apparatus and the finger is smaller than distances between upper surfaces of capacitive pixel units at the middle portion of the biological information identification apparatus and the finger, a manner that the cross section areas of the conductive elements at the edge portions are smaller than the cross section areas of the conductive elements in the middle portion enables fingerprint information obtained by the capacitive pixel units in different positions of the biological information identification apparatus to be in consistency as much as possible. This facilitates algorithm processing to fingerprint signals, while reducing a risk of data saturation of the fingerprint signals, and achieves the objective of improving performance of fingerprint identification. For example, when the top surface of the packaging layer is an arc surface, the packaging layer has its middle portion thick and its edge portions thin. As a result, the distances between the upper surfaces of the capacitive pixel units at the edge portion of the biological information identification apparatus and the finger are smaller than the distances between the upper surfaces of the capacitive pixel units at the middle portion of the biological information identification apparatus and the finger. Therefore, the manner that the cross section areas of the conductive elements at the edge portions are smaller than the cross section areas of the conductive elements at the middle portion may guarantee that signals obtained at each of the capacitive pixel units are generally equal in magnitude.

In one example, bottoms of the plurality of conductive elements are spaced from tops of the plurality of capacitive pixel units. The fingerprint identification module further comprises a dielectric layer provided between the plurality of capacitive pixel units and the plurality of conductive elements. The dielectric layer is disposed above the upper surface of the fingerprint identification chip and covers the plurality of capacitive pixel units. The dielectric layer includes a first surface adjacent to the packaging layer, and the plurality of conductive elements is disposed on the first surface.

In one example, the first surface is an arc surface. This offsets or reduces effect of non-flat packaging layer on the magnitude of the signal.

In one example, a height of each of the plurality of conductive elements is greater than or equal to 100 μm.

In one example, a cross section area of each of the plurality of conductive elements is in a range from 400 μm² to 900 μm².

In one example, a distance between any two adjacent conductive elements of the plurality of conductive elements is in a range from 20 μm to 30 μm.

In one example, each of the plurality of conductive elements is disposed corresponding to a respective one of the plurality of capacitive pixel units. In this way, while it is ensured that without any change to resolution, the magnitude of the signals to be detected at various locations of the biological information identification apparatus is increased, and accuracy of fingerprint identification is improved.

In one example, the plurality of conductive elements are copper pillars.

In one example, the biological information identification apparatus is disposed at a side surface of the electronic device.

DETAILED DESCRIPTION

The embodiments of the present disclosure will be described in detail below with reference to the accompanying drawings in order to make the objectives, technical solutions and advantages of the present disclosure clearer. However, it will be apparent to those skilled in the art that, in the various embodiments of the present disclosure, numerous technical details are set forth in order to provide the reader with a better understanding of the present disclosure. However, the technical solutions claimed in the present disclosure can be implemented without these technical details and various changes and modifications based on the following embodiments.

Figure 1:
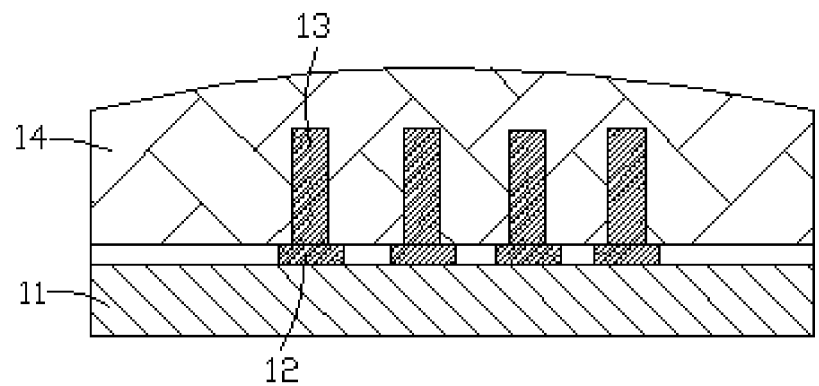
FIG. 1 is a structural schematic diagram of an example of a biological information identification apparatus according to an embodiment of the present disclosure.

Embodiments of the present disclosure provide a biological information identification apparatus. As shown in FIG. 1, the biological information identification apparatus provided according to the present embodiment includes a fingerprint identification module and a package layer 14 disposed on a surface of the fingerprint identification module facing a user. The packaging layer 14 is configured to package the fingerprint identification module to insulate the fingerprint identification module from the outside. A top surface of the packaging layer 14 is an arc surface. The fingerprint identification module includes a fingerprint identification chip 11 and a plurality of capacitive pixel units 12. The capacitive pixel units 12 are disposed on an upper surface of the fingerprint identification chip 11. The plurality of capacitive pixel units 12 are configured to collect user's fingerprint information. The fingerprint identification chip 11 is configured to identify fingerprint information. The capacitive pixel units 12 are configured to form capacitance with a finger of the user. The biological information identification apparatus further includes a plurality of conductive elements 13 disposed above the capacitive pixel units 12.

The fingerprint identification chip 11 for identifying fingerprint information is provided with the plurality of capacitive pixel units 12, and the conductive elements 13 are additionally provided above the capacitive pixel units 12. According to a calculation formula of $C=\varepsilon S/4\pi kd$ for calculating a capacitance value formed by each capacitive pixel unit 12 during sensing a fingerprint, in which d is a distance of a top end of a conductive element 13 from the finger (when the conductive elements 13 are removed, d is a distance of an upper surface of a capacitive pixel unit 12 from the finger). When the finger presses above the capacitive pixel units 12 for identification, the additional conductive element 13, serving as a conductor, reduces a distance d between the fingerprint and the upper surface of the capacitive pixel unit 12 in a disguised manner, thereby the capacitance value C of the capacitance formed by the capacitive pixel unit is increased. Therefore, when the biological information identification apparatus is applied to an electronic device, the fingerprint identification module may form a signal with a larger magnitude. Further, a possibility is reduced in which identification fails or the magnitude of the signal is too small to render sufficiently accurate identification. For example, even if an insulation element above or beyond the capacitive pixel units in the fingerprint identification module is thick, the biological information identification apparatus provided in the present disclosure is also able to perform accurate fingerprint identification.

In the following, implementation of the biological information identification apparatus in this embodiment will be described in detail. The following content are only implementation details provided to facilitate understanding but are not necessary in this solution.

Figure 2:
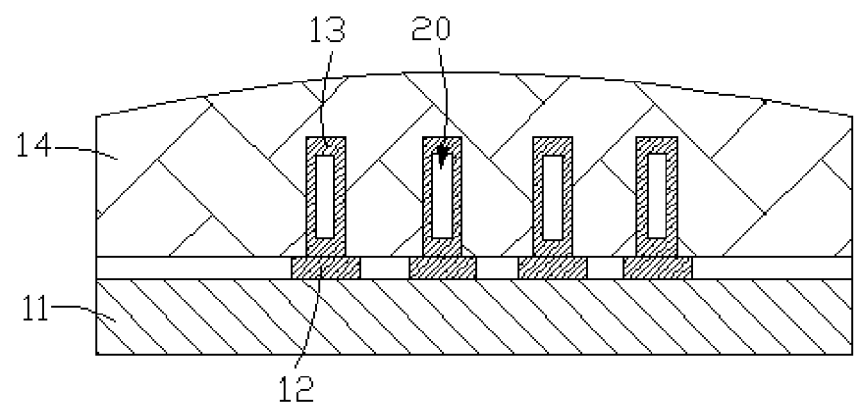
FIG. 2 is a structural schematic diagram of a further example of the biological information identification apparatus according to the embodiment of the present disclosure.

Specifically, the conductive elements 13 may be conductive pillars, which facilitates not only manufacturing (for example, forming pillars through electroplating), but also ensuring consistency of shapes of the conductive elements, thereby improving consistency of capacitive values detected by the capacitance pixel units. Herein, the conductive elements may be made from conductive materials such as gold, silver and copper. In this embodiment, the conductive elements may be copper pillars. Because copper is highly conductive, the fingerprint identification is further improved. In this embodiment, the conductive pillars may be solid. As an example, as shown in FIG. 2, the conductive elements 13 may be alternatively hollow. In this case, each conductive element 13 has a seal chamber 20. This may saves material and cost while ensuring a short distance between the top end of the conductive element 13 and the top surface of the packaging layer 14 to enlarge the magnitude of the signal to be detected, and further prevents material for making a first medium layer from entering the chamber.

In practice, the packaging layer 14 incudes a top surface 142 distant from the fingerprint identification chip 11 and a bottom surface 141 opposite the top surface 142. In this embodiment, the top surface 142 is an arc surface. A traditional capacitive fingerprint identification module has a square or round shape with a flat contact surface which is uncomfortable for a user during use and whose appearance does not look good. Therefore, it is difficult to make a new breakthrough in the user experience due to a lack of novelty of the mobile phone case. Especially, in harsh environments such as sand wind or dust environments in which dust is easily attached on a flat surface, there may be a problem of misjudgment in fingerprint identification during use. However, in this embodiment, since the top surface 142 of the packaging layer 14 is an arc surface, the fingerprint identification module of such design provides a more comfortable hand feeling and a stronger stereo perception, which is totally novel to users. Besides, with the arc surface, when the phone falls down, a contact area of the apparatus is a point rather than a plane, thereby preventing damage to an entire plane of the capacitive fingerprint identification module. Besides, the arc design serves as a buffer when falling of the entire mobile phone. In addition, it is hard for dust to be attached on the arc surface, thereby avoiding misjudgment of fingerprint identification during use. Particularly, in this embodiment, the packaging layer 14 may be a molding layer for packaging the fingerprint identification module to insulate the fingerprint identification module from the outside.

In this embodiment, a bottom of each conductive element 13 is in contact with a top of a respective capacitive pixel unit 12. Therefore, the conductive element 13 and the capacitive pixel unit 12 may form an electrode plate configured to sense the capacitance formed through a finger touch. By the additional conductive element 13, the distance between the upper surface of the capacitive pixel unit 12 and the finger may be reduced in a disguised manner to enlarger the magnitude of the signal to be detected.

Herein, the plurality of conductive elements 13 are equal in height and each has a constant cross section area. The plurality of conductive elements 13 are further equal in cross section area.

Figure 3:
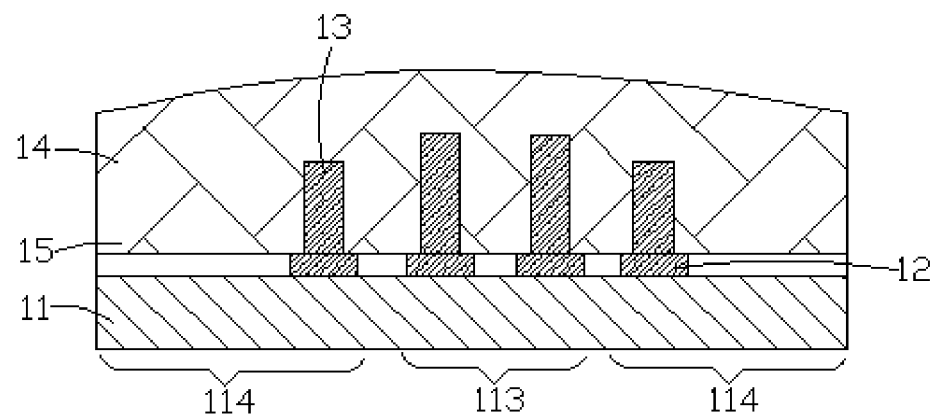
FIG. 3 is a structural schematic diagram of a further example of the biological information identification apparatus according to the embodiment of the present disclosure.

As shown in FIG. 3, in a further example of the biological information identification apparatus according to the present embodiment, the fingerprint identification chip 11 includes a middle portion 113 and an edge portion 114 surrounding the middle portion 113. Heights of the plurality of conductive elements 13 gradually decrease in directions from the middle portion 113 to the edge portion 114. The cross section area of each conductive element 13 is constant, and cross section areas of the plurality of conductive elements 13 are equal. In this way, the biological information identification apparatus fits below a convex area of the terminal to perform fingerprint identification. A change tendency in height of the conductive elements 13 is in accordance with the arc top surface 142 of the packaging layer 14, so that distances between the top surface 142 of the packaging layer 14 and the top ends of the conductive elements 13 are substantially equal. Therefore, when a finger of the user touches the top surface 142, distances between the top ends of the conductive elements 13 and surface of the finger are substantially equal, which improves a condition in which there is a large difference between values of capacitances sensed by the capacitive pixel units 12 in different regions, and is more adaptable to a case in which the biological information identification apparatus is provided below the convex region of the terminal, and is more adaptable to a case in which an insulation layer between the capacitive units in the biological information identification apparatus and the finger is thick or thicknesses of insulation layers differ. For example, with the capacitive fingerprint identification module having an arc surface as shown in FIG. 3, the biological information identification apparatus is enabled to be provided to a side surface of a mobile phone to perform capacitive fingerprint identification, and meanwhile the magnitude of the signal to be detected is enlarged to enable a more accurate fingerprint identification. This enable the biological information identification apparatus to be adaptable to a current prevalent tendency of full screen and enrich experience of a user.

Figure 4:
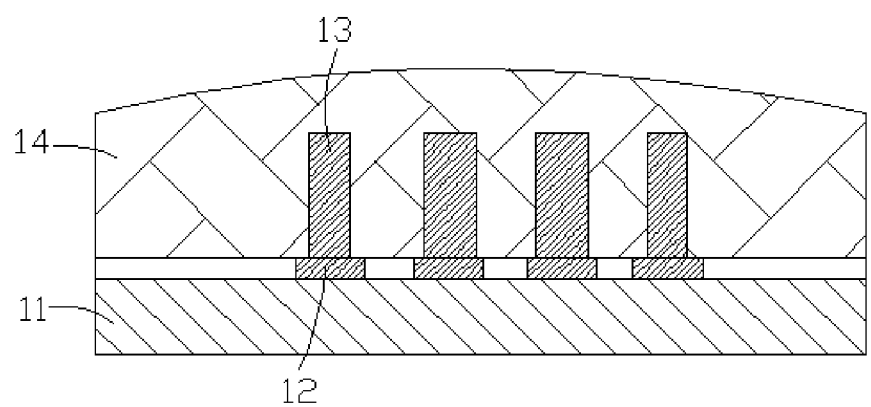
FIG. 4 is a structural schematic diagram of a further example of the biological information identification apparatus according to the embodiment of the present disclosure.

As shown in FIG. 4, in a further example of the biological information identification apparatus structure according to the present embodiment, heights of the plurality of conductive elements 13 are equal, and cross section areas of the plurality of conductive elements 13 gradually decrease in directions from the middle portion 113 to the edge portion 114. Since a capacitance value C sensed by each capacitive pixel unit 12 satisfies the formula of $C=\varepsilon S/4\pi kd$, C is in positive correlation with the cross section area of the conductive element 13, and in negative correlation with d of the respective conductive element 13. With the conductive elements 13 provided above the capacitive pixel units 12, and when the biological information identification apparatus is provided below the convex region of the terminal to perform fingerprint identification (for example, when the biological information identification apparatus is disposed within a power key protruding from the side surface of the mobile phone), the top surface of the packaging layer 14 is an arc surface, and the packaging layer 14 is thick at middle portion and thin at edge portion. In this case, the distances (d) between the capacitive pixel units located at the middle portion of the biological information identification apparatus and the finger are relatively larger, while the distances (d) between the capacitive pixel units at the edge portion of the biological information identification apparatus and the finger are relatively smaller. Therefore, the cross section areas of the plurality of conductive elements 13 may be made gradually decreasing in the directions from the middle portion 113 to the edge portion 114. That is, the cross section areas of the conductive elements 13 at the edge portion is smaller than the cross section areas of the conductive elements 13 at the middle portion, which enables fingerprint information obtained by the capacitive pixel units in different positions of the biological information identification apparatus to be in consistency as much as possible. This facilitates algorithm processing to fingerprint signals, while reducing a risk of data saturation of the fingerprint signals, and achieves the objective of improving performance of fingerprint identification.

Figure 5:
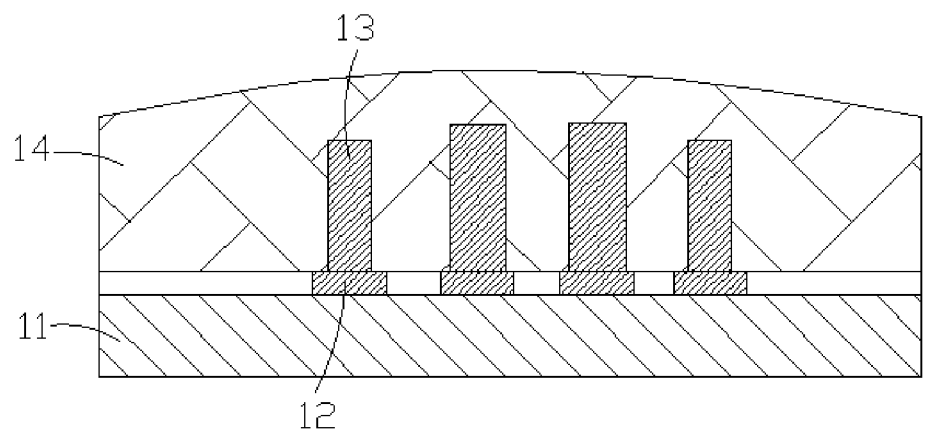
FIG. 5 is a structural schematic diagram of a further example of the biological information identification apparatus according to the embodiment of the present disclosure.

As shown in FIG. 5, in a further example of the biological information identification apparatus structure according to the present embodiment, both the heights and the cross section areas of the plurality of conductive elements 13 gradually decrease in directions from the middle portion 113 to the edge portion 114. Changes of the two dimensions, height and cross section area, of the conductive elements 13 make compensation to a difference in magnitude of the signals obtained in different regions.

Figure 6:
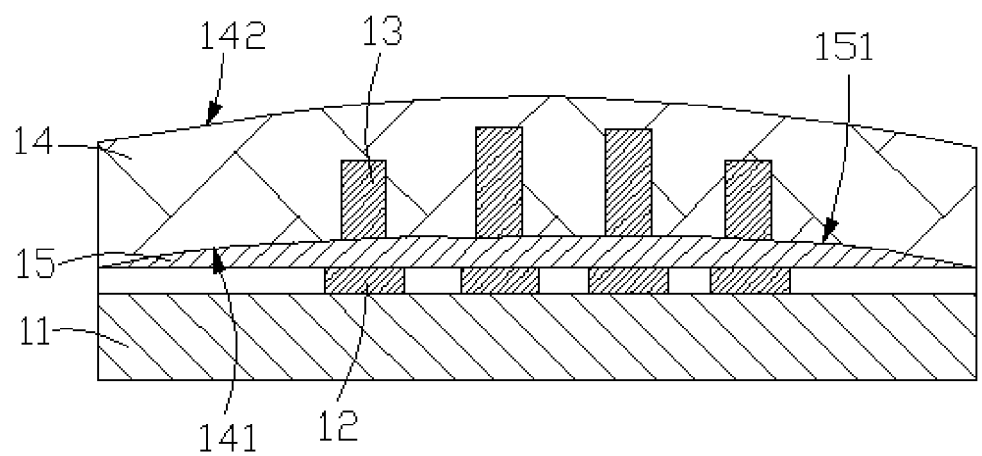
FIG. 6 is a structural schematic diagram of a further example of the biological information identification apparatus according to the embodiment of the present disclosure.

As shown in FIG. 6, bottoms of the conductive elements 13 may be spaced from tops of the capacitive pixel units 12, and a dielectric layer 15 is provided therebetween. In this case, the dielectric layer 15 is provided above the upper surface and covers the plurality of capacitive pixel units 12. The dielectric layer 15 includes a first surface 151 adjacent to the packaging layer 14, and the plurality of conductive elements 13 provided on the first surface 151. Specifically, a first end surface of each conductive element 13 contacts the first surface 151 of the dielectric layer. Herein, the first surface 151 is an arc surface. This offsets or reduces effect of non-flat packaging layer on the magnitude of the signal.

It may be appreciated that regardless of the changes in height of the conductive elements 13, since height differences of the conductive elements 13 are known upon design and manufacturing, a difference in magnitude of the signals, which is resulted from the difference of the distances between the top ends of the conductive elements 13 and the top surface of the packaging layer 14, is offset through design of a software program. In this way, in a case where the differences in magnitude of the signals is offset through software design, a particular structure design (such as changes in height or cross section area) is not required for ensuring consistency of the magnitude of the signals during design and manufacturing, so that structures of the conductive elements 13 are simpler and a manufacturing process thereof is easier.

Alternatively, the top surface 142 may be flat or shaped otherwise. Correspondingly, besides the aforementioned changes in height of the conductive elements 13, the heights of the conductive elements 13 may be changed adaptively according to a shape of a surface where the biological information identification apparatus is installed, so that a shape formed by the ends of the conductive elements 13 matches the shape of the surface where the biological information identification apparatus is installed, for which no more examples will be provided here.

In addition, in order to ensure that without any change to resolution, the magnitude of the signals to be detected at various locations of the biological information identification apparatus is increased, and accuracy of fingerprint identification is improved, in this embodiment, each capacitive pixel unit 12 corresponds to one respective conductive element 13. Alternatively, at least several capacitive pixel units 12 may share a conductive element 13. In this case, the conductive elements 13 is less in quantity than the capacitive pixel units 12, and projections of at least several conductive elements 13 projected on the upper surface 111 partially overlap projections of at least two capacitive pixel units 12 projected on the surface 111. That is, multiple capacitive pixel units 12 correspond to one conductive element 13. By decreasing the amount of the conductive elements 13 and increasing the cross section areas of the conductive elements 13, difficulty of a manufacturing process for the conductive elements 13 is reduced.

In order to ensure accuracy of fingerprint identification, in practice, it is required that a signal-noise ratio (SNR) is greater than 5, and satisfies SNR=73.35*$\Delta C$, in which SNR is proportional to $\Delta C$. Therefore, the magnitude of the signal needs to be enlarged to meet what is required. Specifically, a calculation formula for a capacitance is $C=\varepsilon S/4\pi kd$. It is seen from the formula that C is affected by a K value of the dielectric layer, a thickness of the dielectric layer and an area of the electrode plate.

Figure 7:
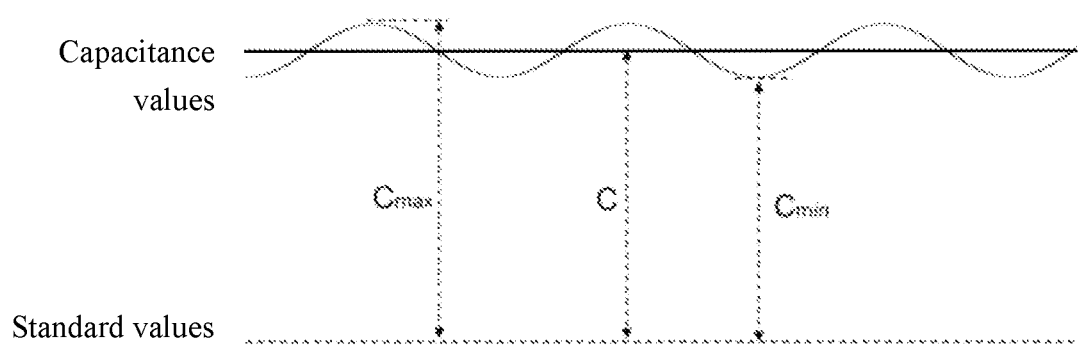
FIG. 7 is a schematic diagram of capacitance values sensed by capacitive pixel units when a finger touches a biological information identification apparatus.

FIG. 7 is a schematic diagram of capacitance values C sensed by the capacitive pixel units 12 when a finger touches a biological information identification apparatus. The magnitude of the fingerprint signal is affected mainly by the capacitance difference $\Delta C$, and the larger $\Delta C$ is, the stronger the fingerprint signal to be detected by the module is. Herein, $\Delta C=C_{max}-C_{min}$, $C_{max}$ is a value corresponding to a peak of a fingerprint while $C_{min}$ is a value corresponding to a valley of the fingerprint when the finger touches the biological information identification apparatus.

In order to know an effect of each factor on the magnitude of the signal, the following simulation experiments are performed according to the control variate method, particular data for which are as follows.

TABLE 1

S and ε remain unchanged (S = 30 μm*30 μm, εPI = 4, εEmc = 7).
The height of the conductive element 13 changes.

| h (um) | ΔC | SNR |
|---|---|---|
| \ | 0.004 | 0.2934 |
| 50 | 0.00618 | 0.453303 |
| 100 | 0.0073 | 0.535455 |
| 150 | 0.0119 | 0.872865 |
| 200 | 0.0215 | 1.577025 |

TABLE 2 h and ε remain unchanged (h = 400 μm, εPI = 4, εEmc = 7).
The height of the conductive element 13 changes.

| S (um2) | ΔC | SNR |
|---|---|---|
| \ | 0.004 | 0.2934 |
| 20 × 20 | 0.00765 | 0.5611275 |
| 25 × 25 | 0.00825 | 0.6051475 |
| 30 × 30 | 0.0073 | 0.535455 |
| 35 × 35 | 0.00692 | 0.507582 |

TABLE 3

The h and S remain unchanged (h = 400 μm, S = 30 μm*30 μm).
The dielectric constants of the packaging layer 14
and dielectric layer 15 change.

| ε PI | ε EMC | ΔC | SNR |
|---|---|---|---|
| 4 | 7 | 0.219 | 16.06365 |
| 7 | 4 | 0.158 | 11.5893 |
| 7 | 7 | 0.262 | 19.2177 |

In Tables 1, 2 and 3, EMC is referred to the packaging layer 14, PI is referred to the dielectric layer 15, εEMC denotes a dielectric constant of the packaging layer 14, εPI denotes a dielectric constant of the dielectric layer 15, h denotes a height of the conductive element 13, S denotes a cross section area of the conductive element 13, and H denotes a thickness of the packaging layer 14.

It shall be noted that the thickness of the packaging layer 14 and the thickness of the dielectric layer 15 are both constant. Particularly, the thickness of the packaging layer 14 is 200 μm, and the thickness of the dielectric layer 15 is 10 μm.

Table 1 shows a tendency of the SNR with a change in height of the conductive element 13 in a case where the cross section area of the conductive element 13, the dielectric constant of the packaging layer 14 and the dielectric constant of the dielectric layer 15 are constant. It is known from the data in Table 1 that the larger the height of the conductive element 13 is, the larger the magnitude of the signal is.

Table 2 shows a tendency of the SNR with a change in cross section area of the conductive element 13 in a case where the height of the conductive element 13, the dielectric constant of the packaging layer 14 and the dielectric constant of the dielectric layer 15 are constant. It is known from the data in Table 2 that the cross section area hardly affects the magnitude of the signal.

Table 3 shows a tendency of the SNR with the change in dielectric constant of the packaging layer 14 and dielectric constant of the dielectric layer 15 in a case where the height and the cross section area of the conductive element 13 are constant. It is known from the data in Table 3 that the larger the dielectric constants of the packaging layer 14 and the dielectric layer 15 are, the larger the capacitance signal amount is.

In addition, it shall be noted that a distance between any two adjacent conductive elements 13 ranges from 20 μm to 30 μm to match distribution of peaks and valleys of the fingerprint.

In order to know an effect on the magnitude of the signal of whether the conductive element 13 is solid or hollow, and whether the dielectric layer 15 is provided, further simulation experiments of SNR detection with thicknesses of different packaging layers 14 are performed, particular data for which are as follows.

TABLE 4 h = 100 um, S = 25 um*25 um, ε PI = 4, ε EMC = 7, H (um)

| H (um) | ΔC | SNR |
|---|---|---|
| 250 | 0.389 | 28.53315 |
| 350 | 0.078 | 5.7214 |

TABLE 5 h = 100 um, S = 25 um*25 um, ε PI = 4, ε EMC = 7

| H (um) | ΔC | SNR |
|---|---|---|
| 250 | 0.218 | 15.9903 |
| 350 | 0.051 | 3.74085 |

TABLE 6 h = 100 um, S = 25 um*25 um, ε PI = 4, ε EMC = 7

| H (um) | ΔC | SNR |
|---|---|---|
| 250 | 0.219 | 16.06365 |
| 350 | 0.052 | 3.8142 |

In Tables 4, 5 and 6, EMC is referred to the packaging layer 14, PI is referred to the dielectric layer 15, εEMC denotes a dielectric constant of the packaging layer 14, εPI denotes a dielectric constant of the dielectric layer 15, h denotes a height of the conductive element 13, S denotes a cross section area of the conductive element 13, and H denotes a thickness of the packaging layer 14.

According to the effects of the height of the conductive element 13, the cross section area of the conductive element 13, the thickness of the packaging layer 14, and the thickness of the dielectric layer 15 on the SNR, in this embodiment, a height of each conductive element 13 may be greater than or equal to 100 μm, a cross section area of the each conductive element 13 may range from 400 to 900 μm$^2$ (preferably, 625 μm$^2$), a thickness of each packaging layer 14 may range from 150 to 250 μm (preferably, 200 μm), and a thickness of the dielectric layer 15 may range from 8 to 12 μm (preferably, 10 μm). By the reasonable values within these ranges, the SNR is enabled to be greater than 5, thereby ensuring accuracy of fingerprint identification.

It shall be noted that the thickness of the dielectric layer 15 keeps constant. Specifically, the thickness of the dielectric layer 15 is 10 μm.

It is known from the above simulation data that under identical conditions, when the conductive element 13 is solid and no dielectric layer 15 is provided (i.e., the conductive element 13 and the capacitive pixel units 12 are directly connected), a signal with a larger magnitude is obtained.

In addition, embodiments of the present disclosure further provide an electronic device which may be a portable electronic apparatus such as a mobile phone and a PAD, including the biological information identification apparatus in any one of the examples according to the aforementioned embodiment.

Optionally, the biological information identification apparatus is provided at a side surface of the electronic device. When the user's finger touches the side surface of the electronic device, the biological information identification apparatus detects a capacitance change, and further, identifies a fingerprint of the user. Because the top surface of the packaging layer of the biological information identification apparatus is an arc surface, the biological information identification apparatus is adaptable to a curved region at the side surface of the electronic device.

Those skilled in the art may understand that the aforementioned embodiments are specific for implementing the present disclosure, which may be modified in terms of form and detail without going beyond the spirit and scope of the present disclosure.

What is claimed is:

1. A biological information identification apparatus, comprising:
    a fingerprint identification module; and
    a packaging layer disposed on a surface of the fingerprint identification module facing a user, and configured to package the fingerprint identification module to insulate the fingerprint identification module from an outside environment, a top surface of the packaging layer being an arc surface;
    the fingerprint identification module comprising:
    a fingerprint identification chip configured to identify fingerprint information of the user, wherein a plurality of capacitive pixel units are disposed on an upper surface of the fingerprint identification chip, and the plurality of capacitive pixel units are configured to form capacitance with a finger of the user; and
    a plurality of conductive elements disposed above the plurality of capacitive pixel units.

2. The biological information identification apparatus according to claim 1, wherein the plurality of conductive elements are hollow.

3. The biological information identification apparatus according to claim 1, wherein bottoms of the plurality of conductive elements are in contact with tops of the plurality of capacitive pixel units.

4. The biological information identification apparatus according to claim 1, wherein the fingerprint identification chip comprises a middle portion and an edge portion surrounding the middle portion, and heights of the plurality of conductive elements gradually decrease in directions from the middle portion to the edge portion.

5. The biological information identification apparatus according to claim 3, wherein cross section areas of the plurality of conductive elements are equal.

6. The biological information identification apparatus according to claim 5, wherein the plurality of conductive elements are conductive pillars.

7. The biological information identification apparatus according to claim 3, wherein heights of the plurality of conductive elements are equal.

8. The biological information identification apparatus according to claim 7, wherein the fingerprint identification chip comprises a middle portion and an edge portion surrounding the middle portion, and cross section areas of the plurality of conductive elements gradually decrease in directions from the middle portion to the edge portion.

9. The biological information identification apparatus according to claim 1, wherein bottoms of the plurality of conductive elements are spaced from tops of the plurality of capacitive pixel units, and the fingerprint identification module further comprises a dielectric layer provided between the plurality of capacitive pixel units and the plurality of conductive elements, and the dielectric layer is disposed above the upper surface of the fingerprint identification chip and covers the plurality of capacitive pixel units; and
    the dielectric layer comprises a first surface adjacent to the packaging layer, and the plurality of conductive elements is disposed on the first surface.

10. The biological information identification apparatus according to claim 9, wherein the first surface of the dielectric layer is an arc surface.

11. The biological information identification apparatus according to claim 1, wherein a height of each of the plurality of conductive elements is greater than or equal to 100 μm.

12. The biological information identification apparatus according to claim 1, wherein a cross section area of each of the plurality of conductive elements is in a range from 400 μm$^2$ to 900 μm$^2$.

13. The biological information identification apparatus according to claim 1, wherein a distance between any two adjacent conductive elements of the plurality of conductive elements is in a range from 20 μm to 30 μm.

14. The biological information identification apparatus according to claim 1, wherein each of the plurality of conductive elements is disposed corresponding to a respective one of the plurality of capacitive pixel units.

15. The biological information identification apparatus according to claim 1, wherein the plurality of conductive elements are copper pillars.

16. An electronic device, comprising a biological information identification apparatus, wherein the biological information identification apparatus comprises a fingerprint identification module, and a packaging layer disposed on a surface of the fingerprint identification module facing a user and configured to package the fingerprint identification module to insulate the fingerprint identification module from an outside, a top surface of the packaging layer being an arc surface;
    the fingerprint identification module comprising:
    a fingerprint identification chip configured to identify fingerprint information of the user, wherein a plurality of capacitive pixel units are disposed on an upper surface of the fingerprint identification chip, and the plurality of capacitive pixel units are configured to generate capacitance with a finger of the user; and
    a plurality of conductive elements disposed above the plurality of capacitive pixel units.

17. The electronic device according to claim 16, wherein the biological information identification apparatus is disposed at a side surface of the electronic device.

18. The electronic device according to claim 16, wherein bottoms of the plurality of conductive elements are in contact with tops of the plurality of capacitive pixel units.

19. The electronic device according to claim 18, wherein cross section areas of the plurality of conductive elements are equal.

20. The electronic device according to claim 19, wherein the plurality of conductive elements are copper pillars.

\* \* \* \* \*